United States Patent [19]

Hollman

[11] Patent Number: 5,070,235
[45] Date of Patent: Dec. 3, 1991

[54] ACCUMULATED EXPOSURE DETECTION WITH EXPOSURE TERMINATING ATTENUATOR

[75] Inventor: Richard F. Hollman, Chelmsford, Mass.

[73] Assignee: General Signal Corporation, Stamford, Conn.

[21] Appl. No.: 539,796

[22] Filed: Jun. 18, 1990

[51] Int. Cl.⁵ .............................................. G01J 1/20
[52] U.S. Cl. .................................. 250/201.1; 354/416
[58] Field of Search ............... 250/201.1, 205, 201 H; 356/215; 354/413, 416, 417, 420, 422, 423

[56] References Cited

U.S. PATENT DOCUMENTS 3,562,344  12/1985  Mihara et al. .................... 250/201.4
4,378,490   3/1983  d'Auria ............................ 250/201.1
4,447,717   5/1984  Nohda ............................. 250/201.4

Primary Examiner—David C. Nelms
Assistant Examiner—Que T. Le
Attorney, Agent, or Firm—Henry D. Pahl, Jr.

[57] ABSTRACT

The method of exposure control disclosed herein is particularly applicable to the pulsed laser illumination of photosensitive resists. The relative illuminating energy provided by successive laser pulses is measured and the successive measurements are accumulated. When the accumulated value approaches the desired exposure level within a preselected difference, an attenuator is inserted in the optical path between the laser and the resist thereby to reduce the exposing energy provided by each pulse to a value below the acceptable deviation. The exposure is terminated when the accumulated value effectively reaches the desired exposure level.

8 Claims, 2 Drawing Sheets

ACCUMULATED EXPOSURE DETECTION WITH EXPOSURE TERMINATING ATTENUATOR

BACKGROUND OF THE INVENTION

The present invention relates to exposure control and more particularly to a method for controlling the exposure of a photosensitive resist illuminated by a pulsed laser.

In the manufacture of semiconductor integrated circuits, the desire to define ever smaller features using microlithographic techniques is leading to the use of shorter and shorter wavelengths. The features are typically formed by exposing a photosensitive resist coated on a semiconductor wafer using a step and repeat projector. Increasing interest is presently being shown in the use of krypton fluoride (KrF) excimer lasers as a light source. These lasers are typically operated in a pulsed mode and are becoming available at greater power levels, both on a per pulse and total average energy basis.

In order to minimize the time spent exposing the resist at each position in the step and repeat process, the availability of increased power is generally desirable. Heretofore, exposure control has been effected by measuring the relative illuminating energy provided by each successive laser pulse and then terminating the exposure when the accumulated value reaches the desired exposure level. However, when the energy delivered by each laser pulse becomes a significant percentage of the total desired exposure, it is not possible to control the exposure with acceptable accuracy merely by terminating the illumination after that pulse which causes the accumulated exposure to reach the desired exposure level.

Among the several objects of the present invention may be noted the provision of a novel method of exposure control; the provision of such a method which is adapted to control the exposure of photosensitive resists illuminated by a pulsed laser; the provision of such a method Which provides precise exposure control; the provision of such a method which will provide precise exposure control when the energy provided by each laser pulse is greater than the acceptable deviation allowed in the overall exposure; the provision of such a method which facilitates high throughput in a step and repeat exposure system; the provision of such a method which is highly reliable; the provision of such a method which may be easily implemented by apparatus which is relatively simple and inexpensive. Other objects and features will be in part apparent and in part pointed out hereinafter.

SUMMARY OF THE INVENTION

In accordance with the method of exposure control of the present invention, the relative illuminating energy provided by successive laser pulse is measured and the successive measurements are accumulated. When the accumulated value approaches a desired exposure level within a preselected difference, an attenutor is inserted in the optical path between the laser and the photosensitive media thereby to reduce the exposing energy provided by each laser pulse. The exposure is then terminated when the accumulated value effectively reaches the desired exposure level.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
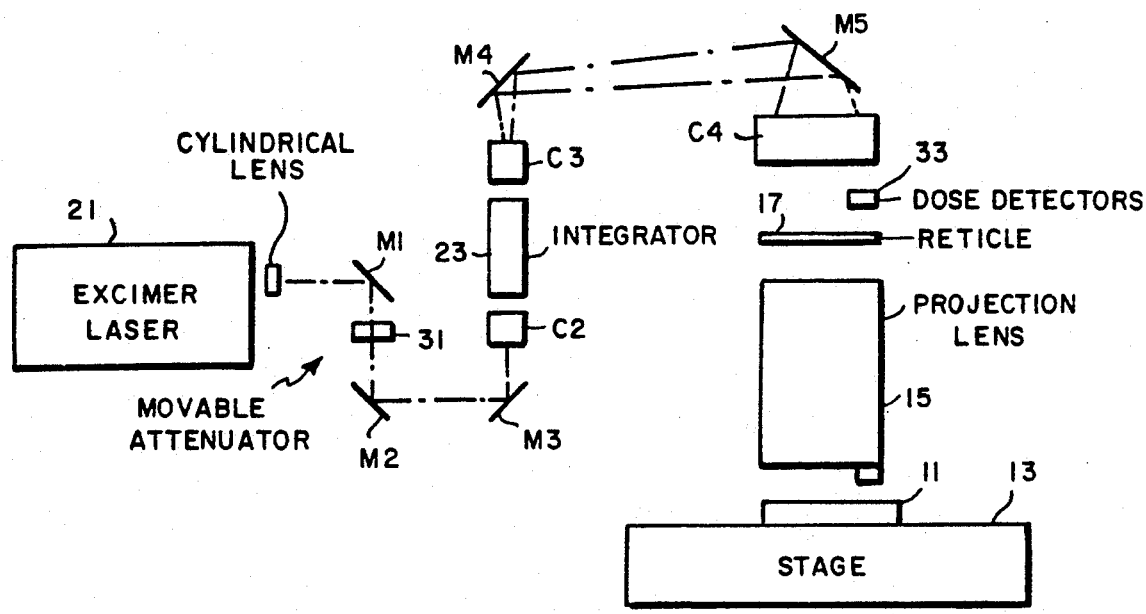
FIG. 1 is a diagram of lithographic apparatus employing the method of exposure control of the present invention.

FIG. 1 illustrates a microlithographic step and repeat projector system employing the method of exposure control of the present invention. The apparatus is generally of the type sold by GCA Corporation of Andover, Massachusetts under the designation Laserstep 200. To define features of an integrated circuit, a semiconductor wafer coated with a suitable resist is held in a chuck 11 mounted on X-Y stage 13 within the projection system. The movable stage allows different regions of the wafer to be brought successively into the field of a projection lens 15. The projection lens 15 forms, on the surface of the wafer, a reduced image of a circuit pattern defined on a reticle 17.

The reticle 17 is illuminated by an excimer laser 21 which is operated in a pulsed mode and emits light at a relatively short wavelength, e.g. 248 nanometers. The laser beam is directed to a condenser lens C4 over the reticle 17 through a folded optical path which includes a cylindrical lens C1, five mirrors M1-M5, an integrator 23 and a pair of lenses C2 and C3 associated with the integrator.

In accordance with the present invention, a movable attenuator is selectively interposed in the optical path between the laser 21 and the reticle 17. In the Laserstep 200 optical system, a convenient point for the attenuator is in the vertical portion of the path between the mirrors M1 and M2. The attenuator is indicated generally by reference character 31. A measurement representative of the energy provided by each successive laser pulse is obtained by means of a photodetector 33 mounted above the reticle 17 in an area unoccupied by any of the circuit features.

Figure 2:
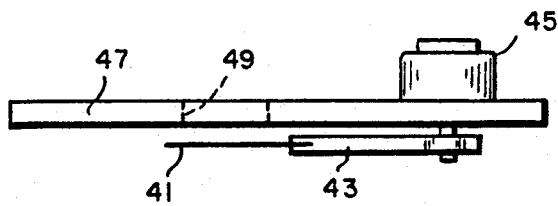
FIG. 2 is a side view of an attenuator assembly employed in the apparatus of FIG. 1.
Figure 3:
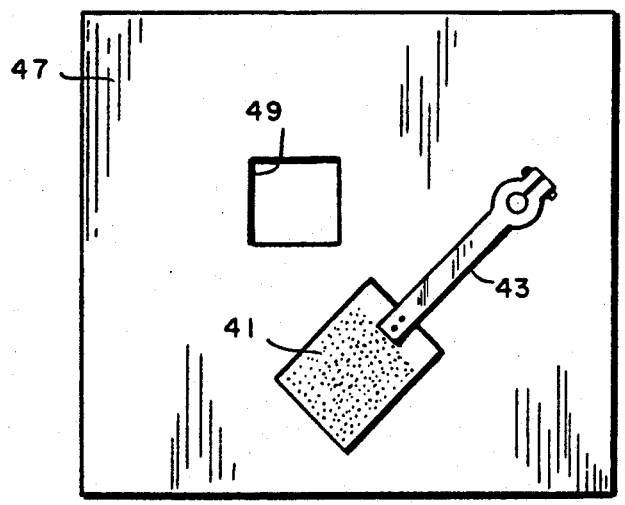
FIG. 3 is a bottom view of the attenuator assembly of FIG. 2.

In the embodiment illustrated, the attenuator itself is simply a metal screen which is selectively moved into the path of the laser beam. The screen may for example be that sold by the Buckbee-Mears Corporation of St. Paul, Minn. under the trade name "Micro-etch". This material provides a transmission of about 20% of the laser beam. As illustrated in FIGS. 2 and 3, the screen, designated by reference character 41, is mounted on a pivotal arm 43 which can be rotated by means of a rotary solenoid 45. The solenoid 45 is mounted on a base plate 47 which is apertured as indicated at 49 to provide a path for the laser beam. When the solenoid is energized, the screen is rotated into alignment with the aperture, thereby attenuating the intensity of the beam essentially by a factor of 5.

Figure 4:
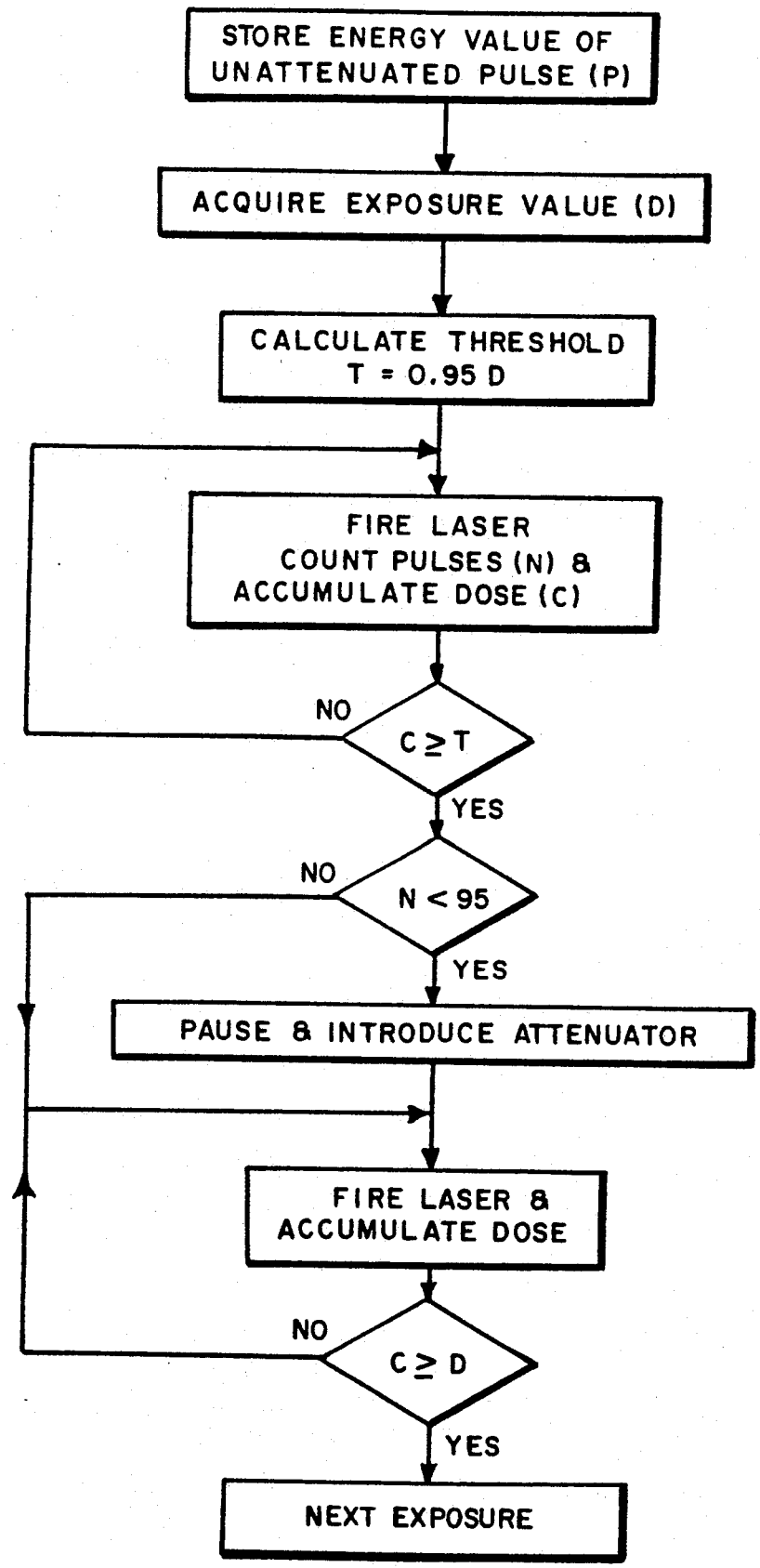
FIG. 4 is a flowchart illustrating the steps of the method of exposure control of the present invention.

FIG. 4 illustrates an algorithm which implements the method of the present invention to achieve 1% exposure control using as few as 20 laser pulses per exposure where each unattenuated laser pulse can provide about 5% of the total exposure desired.

During set up of the equipment, the relative illuminating energy provided by each unattenuated laser pulse is measured and stored. This value is designated P in FIG. 4. Based on the characteristics of the particular resist used, the operator or an automated data system provides a value (D) representing the desired exposure or level for the wafer. The threshold for the possible introduction of the attenuator (T) is then calculated simply as 95% of the dose D. Fire of the laser is then initiated and, during the firing, the exposure is accumulated (C) and the pulses are counted (N).

During the laser firing, the accumulated exposure is compared with the calculated threshold. Once the threshold is reached, the number of firings is compared with the number 95. If the number is less than 95, i.e. indicating that each pulse is contributing more than 1% of the desired dose, the attenuator is introduced. Firing of the laser is then reinitiated and continued until the accumulated exposure reaches the desired dose.

By employing the method of the present invention, most of the exposure is accumulated relatively quickly using the full power of the laser but the final value is approached in relatively small steps, i.e. one fifth of the full incremental exposure, so that exposure can be terminated at a total value which is very close to the desired exposure level, i.e. within the acceptable deviation. While particular parameters have been described by way of example and represent a presently preferred choice, it should be understood that other values, i.e. 5% transmission for the attenuator, might also be used to achieve even greater precision in exposure control.

It should also be understood that the method of the present invention might be implemented in two stages using two attenuators which are introduced at respective threshold levels so that even higher power lasers might be accommodated to accomplish a majority of the exposure; an intermediate exposure dose might then be implemented to approach the desired exposure level at an intermediate incremental rate; and then a final, relatively small incremental dose might be employed to reach the desired exposure level with a high degree of precision.

The method of exposure control described here is not restricted to use with pulsed KrF excimer laser illumination, but is applicable to any type of lithographic exposure in which the source of exposure energy is pulsed, for example some embodiments of x-ray lithography. It could be used in cases where the required precision in dose is smaller than the dose increment from a single full pulse.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A method of controlling exposure in the illumination of photosensitive materials by a respectively pulsed light source to more accurately obtain a desired exposure level, said method comprising:
   measuring the relative illuminating energy provided by successive pulses;
   accumulating the successive measurements;
   detecting when the accumulated value approaches the desired exposure level within a preselected difference;
   inserting an attenuator in the light path between the source and the photosensitivie material, thereby to reduce the exposing energy provided by each pulse;
   terminating the exposure when the accumulated value effectively reaches the desired exposure level.

2. A method of controlling exposure to an accuracy within a preselected acceptable deviation in the illumination of photosensitive resists by a repetitively pulsed laser light source, said method comprising:
   measuring the relative illuminating energy provided by successive laser pulses;
   accumulating the successive measurements;
   detecting when the accumulated value approaches the desired exposure level within a preselected difference which is greater than said preselected deviation;
   inserting an attenuator in the light path between the laser and the resist thereby to reduce the exposing energy provided by each laser pulse to a value below the acceptable deviation;
   terminating the exposure when the accumulated value effectively reaches the desired exposure level within the acceptable deviation.

3. The method as set forth in claim 2 wherein said attenuator is a screen.

4. The method as set forth in claim 3 wherein said screen provides a transmission of the laser light of about 20%.

5. A method of controlling exposure to an accuracy within a preselected acceptable deviation from a predetermined desired total exposure value during the illumination of photosensitive resists by a repetitively pulsed laser light source, said method comprising:
   measuring the relative illuminating energy provided by each laser pulse;
   calculating a threshold value which is below said desired total exposure value by more than the energy provided by a single laser pulse;
   during exposure of the resist, measuring the relative illuminating energy provided by successive laser pulses;
   accumulating the successive measurements during exposure;
   detecting when the accumulated value reaches said threshold value;
   inserting an attenuator in the light path between the laser and the resist thereby to reduce the exposing energy provided by each laser pulse to a value below the acceptable deviation;
   terminating the exposure when the accumulated value effectively reaches the desired exposure level.

6. Apparatus for controlling the exposure of photosensitive resists to an accuracy within a preselected acceptable deviation from a predetermined desired total exposure value during the pulsed laser illumination of the resists, said apparatus comprising:
   means for measuring the relative illuminating energy provided by successive laser pulses during exposure of the resist;
   means for accumulating the successive measurements during exposure;

means for calculating a threshold value which is below said desired total exposure value by more than the energy provided by a single laser pulse;

means for detecting when the accumulated value reaches said threshold value;

an attenuator;

means responsive to said detecting means for inserting said attenuator in the light path between the laser and the resist thereby to reduce the exposing energy provided by each laser pulse to a value below the acceptable deviation;

means for terminating the exposure when the accumulated value effectively reaches the desired exposure level.

7. In a microlithographic system for exposing photosensitive resists using pulsed laser illumination, apparatus for selectively reducing the exposing energy provided by each laser pulse, said apparatus comprising:

an attenuating screen;

a pivotally mounted arm carrying said screen;

and means for moving said arm between pulses to bring said screen into the optical path between the laser and the resist.

8. Apparatus as set forth in claim 7 wherein said moving means is a rotary solenoid.

* * * * *

UNITED STATES PATENT AND TRADEMARK OFFICE
CERTIFICATE OF CORRECTION

PATENT NO. : 5,070,235

DATED : December 3, 1991

INVENTOR(S) : Richard F. Hollman

It is certified that error appears in the above-identified patent and that said Letters Patent is hereby corrected as shown below:

Claim 1, Column 3, line 64, "respectively" should be --repetitively--.

Signed and Sealed this

Thirty-first Day of August, 1993

Attest:

BRUCE LEHMAN

*Attesting Officer*     *Commissioner of Patents and Trademarks*